(12) United States Patent
Cao

(10) Patent No.: US 11,205,666 B2
(45) Date of Patent: Dec. 21, 2021

(54) ARRAY SUBSTRATE AND DISPLAY PANEL

(71) Applicant: WUHAN CHINA STAR OPTOELECTRONICS TECHNOLOGY CO., LTD, Wuhan (CN)

(72) Inventor: Zhihao Cao, Wuhan (CN)

(*) Notice: Subject to any disclaimer, the term of this patent is extended or adjusted under 35 U.S.C. 154(b) by 479 days.

(21) Appl. No.: 16/306,589

(22) PCT Filed: Aug. 7, 2018

(86) PCT No.: PCT/CN2018/099112
§ 371 (c)(1),
(2) Date: Dec. 3, 2018

(87) PCT Pub. No.: WO2019/205341
PCT Pub. Date: Oct. 31, 2019

(65) Prior Publication Data
US 2021/0225894 A1     Jul. 22, 2021

(30) Foreign Application Priority Data
Apr. 28, 2018   (CN) .......................... 201810399220.4

(51) Int. Cl.
H01L 33/00     (2010.01)
H01L 21/00     (2006.01)
H01L 27/12     (2006.01)

(52) U.S. Cl.
CPC ...... H01L 27/1244 (2013.01); H01L 27/1262 (2013.01)

(58) Field of Classification Search
CPC ............. H01L 27/3244; H01L 27/3281; H01L 27/1214

USPC ........................................ 438/29, 69; 257/98
See application file for complete search history.

(56) References Cited

U.S. PATENT DOCUMENTS

| | | | |
|---|---|---|---|
| 10,319,944 B2 * | 6/2019 | Lee | H01L 27/3248 |
| 10,446,636 B2 * | 10/2019 | Lee | H01L 27/124 |
| 10,566,353 B2 * | 2/2020 | Lee | H01L 29/42384 |
| 10,811,483 B2 * | 10/2020 | Song | G09G 3/3266 |
| 10,871,669 B2 * | 12/2020 | Yamazaki | G02F 1/133345 |
| 2003/0001998 A1 | 1/2003 | Kun | |
| 2010/0001944 A1 | 1/2010 | Seong et al. | |
| 2011/0121761 A1 | 5/2011 | Zhao | |
| 2011/0221795 A1 | 9/2011 | Ran et al. | |
| 2011/0279043 A1 | 11/2011 | Hagino et al. | |
| 2012/0098869 A1 | 4/2012 | Tseng et al. | |
| 2016/0357056 A1 | 12/2016 | Kang | |

(Continued)

FOREIGN PATENT DOCUMENTS

| | | |
|---|---|---|
| CN | 101547540 A | 9/2009 |
| CN | 101621870 A | 1/2010 |
| CN | 102237040 A | 11/2011 |

(Continued)

*Primary Examiner* — Calvin Lee

(57) ABSTRACT

An array substrate and a display panel are provided. The array substrate includes a first region and a second region. The first region corresponds to a display region of the display panel. The second region corresponds a non-display region of the display panel. The second region includes a substrate and an electrically conductive line formed on the substrate. The second region further includes at least one metal pattern formed between the substrate and the electrically conductive line.

9 Claims, 2 Drawing Sheets

(56) References Cited

U.S. PATENT DOCUMENTS

2016/0374184 A1    12/2016  Zhang
2019/0041709 A1     2/2019  Jiang et al.

FOREIGN PATENT DOCUMENTS

| CN | 102253544 A  | 11/2011 |
| CN | 102458021 A  |  5/2012 |
| CN | 102737602 A  | 10/2012 |
| CN | 202585418 U  | 12/2012 |
| CN | 202631908 U  | 12/2012 |
| CN | 103280189 A  |  9/2013 |
| CN | 104362153 A  |  2/2015 |
| CN | 104834143 A  |  8/2015 |
| CN | 205751478 U  | 11/2016 |
| CN | 107037648 A  |  8/2017 |

* cited by examiner

ARRAY SUBSTRATE AND DISPLAY PANEL

FIELD OF INVENTION

The present disclosure relates to a technical field of flat panel displays, and more particularly to an array substrate and a display panel.

BACKGROUND OF INVENTION

Liquid crystal displays (LCDs) are a type of flat panel displays widely used. LCDs mainly modulate light field intensities of backlight sources through liquid crystal switches, to realize image display. LCD display devices include thin film transistor (TFT) devices. Each liquid crystal pixel on a TFT-LCD display is driven by thin film transistors integrated therein. Therefore, TFT-LCD displays have advantages of high response speed, high brightness, high contrast, small size, low power consumption, no radiation, etc., and dominate a current display market.

In the related art, based on cost considerations, an array substrate manufactured and bonded to a color film substrate needs to be cut into a plurality of display panels of equal size. A display panel includes an array substrate cutting line and a color film substrate cutting line. A spacing between the color film substrate cutting line and a display region is smaller than a spacing between the array substrate cutting line and the display region. Thus, the color film substrate cutting line is located above a peripheral trace of the array substrate.

When the color film substrate is being cut, a force generated during cutting deforms a film layer structure of the corresponding array substrate. A metal trace of the film layer structure is irreversibly broken because of deformation, causing the display panel to be abnormal, and reducing product yields.

SUMMARY OF INVENTION

The present disclosure provides an array substrate and a display panel, to solve the technical problem that a trace is broken when an existing color film substrate is being cut for production.

In order to solve the aforementioned problem, the present disclosure provides the following technical solutions.

The present disclosure provides an array substrate including:

a first region corresponding to a display region of a display panel; and a second region disposed on an outer side of the first region, wherein the second region corresponds to a non-display region of the display panel;

wherein the second region includes a substrate, at least one inorganic layer formed on the substrate, and an electrically conductive line formed on the at least one inorganic layer; and wherein the second region further includes at least one metal pattern formed between the substrate and the electrically conductive line, and the at least one metal pattern or a portion of the at least one metal pattern is covered by the electrically conductive line.

In accordance with a preferred embodiment of the present disclosure, the array substrate further includes:

a first cutting boundary and a second cutting boundary;

wherein the first cutting boundary and the electrically conductive line cross each other; and wherein the first cutting boundary and the second cutting boundary are parallel to a first boundary of the first region, and a spacing between the first cutting boundary and the first boundary is smaller than a spacing between the second cutting boundary and the first boundary.

In accordance with a preferred embodiment of the present disclosure, the at least one metal pattern is formed under a crossing point of the first cutting boundary and the electrically conductive line.

In accordance with a preferred embodiment of the present disclosure, the at least one inorganic layer includes a buffer layer, a dielectric layer, and a planarization layer formed on the substrate; and one of the at least one metal pattern is formed between the substrate and one of the at least one inorganic layer, or between adjacent two of the at least one inorganic layer.

In accordance with a preferred embodiment of the present disclosure, the at least one metal pattern includes one or a combination of a first metal pattern, a second metal pattern, and a third metal pattern; and the first metal pattern corresponds to a light shielding layer in the first region, the second metal pattern corresponds to a gate in the first region, and the third metal pattern corresponds to a source/drain in the first region.

In accordance with a preferred embodiment of the present disclosure, the first metal pattern is formed on the substrate, and is located between the substrate and the buffer layer;

the second metal pattern is formed on the buffer layer, and is located between the buffer layer and the dielectric layer; and the third metal pattern is formed on the dielectric layer, and is located between the dielectric layer and the planarization layer.

In accordance with a preferred embodiment of the present disclosure, the first metal pattern and the light shielding layer are formed using a first patterning process, the second metal pattern and the gate are formed using a second patterning process, and the third metal pattern and the source/drain are formed using a third patterning process.

In accordance with a preferred embodiment of the present disclosure, the array substrate further includes:

a first insulating layer and a second insulating layer;

wherein the first insulating layer is formed on the at least one inorganic layer, the electrically conductive line is formed on the first insulating layer, and the second insulating layer is formed on the electrically conductive line.

The present disclosure also provides an array substrate including:

a first region corresponding to a display region of a display panel; and a second region disposed on an outer side of the first region, wherein the second region corresponds to a non-display region of the display panel;

wherein the second region includes a substrate, at least one inorganic layer formed on the substrate, and an electrically conductive line formed on the at least one inorganic layer; and wherein the second region further includes at least one metal pattern formed between the substrate and the electrically conductive line.

In accordance with a preferred embodiment of the present disclosure, the array substrate further includes:

a first cutting boundary and a second cutting boundary;

wherein the first cutting boundary and the electrically conductive line cross each other; and wherein the first cutting boundary and the second cutting boundary are parallel to a first boundary of the first region, and a spacing between the first cutting boundary and the first boundary is smaller than a spacing between the second cutting boundary and the first boundary.

In accordance with a preferred embodiment of the present disclosure, the at least one metal pattern is formed under a crossing point of the first cutting boundary and the electrically conductive line.

In accordance with a preferred embodiment of the present disclosure, the at least one inorganic layer includes a buffer layer, a dielectric layer, and a planarization layer formed on the substrate; and one of the at least one metal pattern is formed between the substrate and one of the at least one inorganic layer, or between adjacent two of the at least one inorganic layer.

In accordance with a preferred embodiment of the present disclosure, the at least one metal pattern includes one or a combination of a first metal pattern, a second metal pattern, and a third metal pattern; and the first metal pattern corresponds to a light shielding layer in the first region, the second metal pattern corresponds to a gate in the first region, and the third metal pattern corresponds to a source/drain in the first region.

In accordance with a preferred embodiment of the present disclosure, the first metal pattern is formed on the substrate, and is located between the substrate and the buffer layer;

the second metal pattern is formed on the buffer layer, and is located between the buffer layer and the dielectric layer; and the third metal pattern is formed on the dielectric layer, and is located between the dielectric layer and the planarization layer.

In accordance with a preferred embodiment of the present disclosure, the first metal pattern and the light shielding layer are formed using a first patterning process, the second metal pattern and the gate are formed using a second patterning process, and the third metal pattern and the source/drain are formed using a third patterning process.

In accordance with a preferred embodiment of the present disclosure, the array substrate further includes:

a first insulating layer and a second insulating layer;

wherein the first insulating layer is formed on the at least one inorganic layer, the electrically conductive line is formed on the first insulating layer, and the second insulating layer is formed on the electrically conductive line.

The present disclosure also provides a display panel. The display panel includes any of the aforementioned array substrates.

Advantageous effects: By disposing the at least one metal pattern between the substrate in the second region and the electrically conductive line, hardness of a film layer structure of the region is increased. Deformation of the array substrate caused during cutting and splintering is reduced. Breakage of the electrically conductive line is prevented. Product yields are increased.

DESCRIPTION OF DRAWINGS

In order to describe a technical solution in embodiments or existing technology more clearly, drawings required to be used by the embodiments or the existing technology are briefly introduced below. Obviously, the drawings in the description below are only some embodiments of the present disclosure. With respect to persons of ordinary skill in the art, under a premise that inventive efforts are not made, other drawings may be obtained based on these drawings.

DETAILED DESCRIPTION OF PREFERRED EMBODIMENTS

Figure 1:
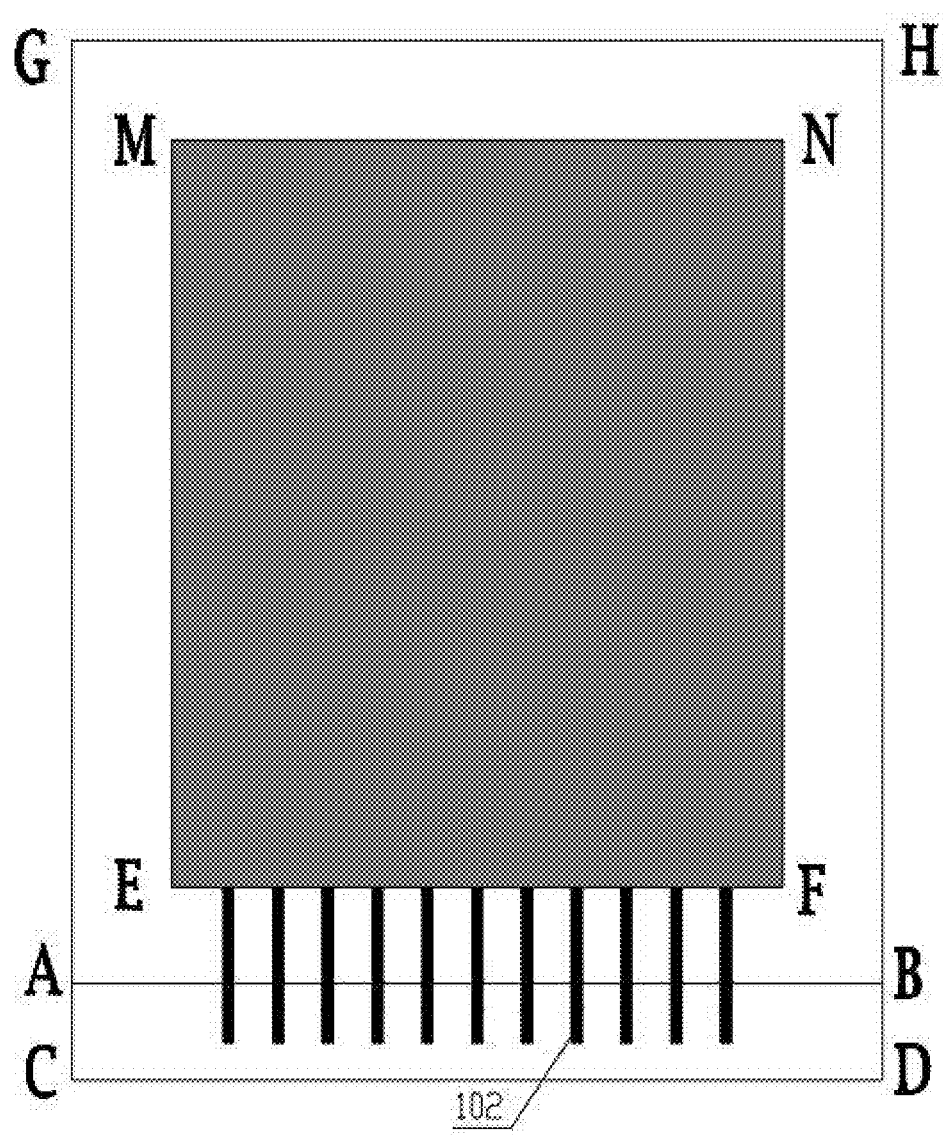
FIG. 1 is a top-view diagram of an array substrate in accordance with an embodiment of the present disclosure.

The description of each embodiment below refers to respective accompanying drawing(s), so as to illustrate exemplarily specific embodiments of the present disclosure that may be practiced. Directional terms mentioned in the present disclosure, such as "upper", "lower", "front", "back", "left", "right", "inner", "outer", "side", etc., are only directions by referring to the accompanying drawings, and thus the used directional terms are used to describe and understand the present disclosure, but the present disclosure is not limited thereto. In the drawings, structurally similar units are labeled by the same reference numerals.

FIG. 1 is a top-view diagram of an array substrate in accordance with an embodiment of the present disclosure. The array substrate includes a first region and a second region. An area corresponding to the first region is a region MNFE.

In the present embodiment, the first region corresponds to a display region of a display panel. The second region corresponds a non-display region of the display panel, and is disposed on an outer side of the first region. That is, the second region is a region GHDC without the region MNFE.

The array substrate further includes a first cutting boundary AB and a second cutting boundary CD. The first cutting boundary AB and the second cutting boundary CD are located at the second region. The first cutting boundary AB and the second cutting boundary CD are only reference lines for cutting, and have no other meaning.

In the present embodiment, the first cutting boundary AB is a color film substrate cutting line. The second cutting boundary CD is an array substrate cutting line. Because an area of a color film substrate is smaller than an area of the array substrate, cutting needs to be performed to obtain the color film substrate.

In FIG. 1, a region ABHG is the color film substrate. The region GHDC is the array substrate. A color film substrate corresponding to the array substrate is cut according to the first cutting boundary AB, to remove a region ABDC. The second cutting boundary CD is a cutting reference line of the array substrate.

In the present embodiment, the first cutting boundary AB and the second cutting boundary CD are parallel to a first boundary EF of the first region, and a spacing between the first cutting boundary AB and the first boundary EF is smaller than a spacing between the second cutting boundary CD and the first boundary EF.

Figure 2:
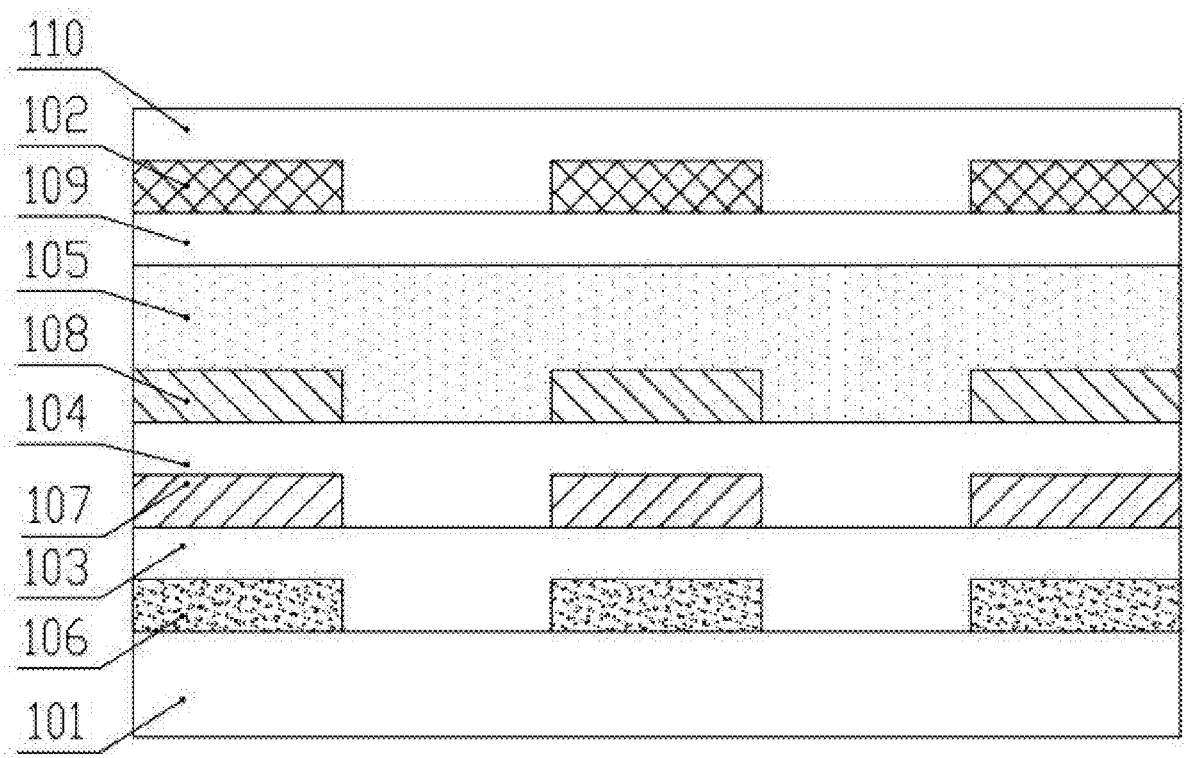
FIG. 2 is a structural diagram of film layers of an array substrate corresponding to a first cutting boundary AB in FIG. 1.

FIG. 2 is a structural diagram of film layers of the array substrate corresponding to the first cutting boundary AB in FIG. 1. The second region includes a substrate 101, at least one inorganic layer formed on the substrate 101, and an electrically conductive line 102 formed on the at least one inorganic layer.

The second region further includes at least one metal pattern formed between the substrate 101 and the electrically conductive line 102.

In the present embodiment, the at least one metal pattern is formed under the electrically conductive line 102. That is, the at least one metal pattern or a portion of the at least one metal pattern is covered by the electrically conductive line 102. Preferably, in order to save raw material or ensure array substrate light transmittance, the at least one metal pattern further exists only under the first cutting boundary AB, i.e. under a crossing point of the first cutting boundary AB and the electrically conductive line 102.

In the present embodiment, the at least one inorganic layer includes a buffer layer 103, a dielectric layer 104, and a planarization layer 105 formed on the substrate 101. One of the at least one metal pattern is formed between the substrate 101 and one of the at least one inorganic layer, or between adjacent two of the at least one inorganic layer. The at least one metal pattern includes one or a combination of a first metal pattern, a second metal pattern, and a third metal pattern.

As illustrated in FIG. 2, in the present embodiment, the second region includes three layers of metal patterns, i.e. a first metal pattern 106, a second metal pattern 107, and a third metal pattern 108. The first metal pattern 106 is formed on the substrate 101, and is located between the substrate 101 and the buffer layer 103. The second metal pattern 107 is formed on the buffer layer 103, and is located between the buffer layer 103 and the dielectric layer 104. The third metal pattern 108 is formed on the dielectric layer 104, and is located between the dielectric layer 104 and the planarization layer 105.

In addition, the first region, i.e. the display region, includes a light shielding layer, a gate, and a source/drain. In the present embodiment, the first metal pattern corresponds to the light shielding layer in the first region, the second metal pattern corresponds to the gate in the first region, and the third metal pattern corresponds to the source/drain in the first region.

That is, the first metal pattern 106 and the light shielding layer are of a same film layer structure of the array substrate. The second metal pattern 107 and the gate are of a same film layer structure of the array substrate. The third metal pattern 108 and the source/drain are of a same film layer structure of the array substrate. That is, the first metal pattern 106 and the light shielding layer are formed using a first patterning process, the second metal pattern 107 and the gate are formed using a second patterning process, and the third metal pattern 108 and the source/drain are formed using a third patterning process. The at least one metal pattern added by the present disclosure may improve product yields without requiring additional other mask processes.

As illustrated in FIG. 2, the array substrate located at the second region further includes a first insulating layer 109 and a second insulating layer 110. The first insulating layer 109 is formed on the at least one inorganic layer, the electrically conductive line 102 is formed on the first insulating layer 109, and the second insulating layer 110 is formed on the electrically conductive line 102.

When the color film substrate is formed by cutting in accordance with the first cutting boundary, because the array substrate corresponding to the first cutting boundary has at least one additional metal pattern compared to the related art, and because metal has higher hardness, the maximum stress that the region can bear is larger than that of a film layer structure of the related art. When a same cutting force is applied, the film layer structure of the region deforms less. Breakage of the electrically conductive line is prevented. Product yields are increased. Moreover, in order to ensure array substrate light transmittance, the at least one metal pattern are all disposed under the electrically conductive line, and are covered by the electrically conductive line.

The present disclosure also provides a display panel. The display panel includes any of the aforementioned array substrates.

The present invention provides an array substrate and a display panel. The array substrate includes a first region and a second region. The first region corresponds to a display region of the display panel. The second region corresponds to a non-display region of the display panel, and is disposed on an outer side of the first region. The array substrate located at the second region includes a substrate, at least one inorganic layer formed on the substrate, and an electrically conductive line formed on the at least one inorganic layer. In addition, the second region further includes at least one metal pattern formed between the substrate and the electrically conductive line. By disposing the at least one metal pattern between the substrate in the second region and the electrically conductive line, hardness of a film layer structure of the region is increased. Deformation of the array substrate caused during cutting and splintering is reduced. Breakage of the electrically conductive line is prevented. Product yields are increased.

In summary, although the present disclosure has been described with preferred embodiments thereof above, it is not intended to be limited by the foregoing preferred embodiments. Persons skilled in the art can carry out many changes and modifications to the described embodiments without departing from the scope and the spirit of the present disclosure. Therefore, the protection scope of the present disclosure is in accordance with the scope defined by the claims.

What is claimed is:

1. An array substrate, comprising a display region and a non-display region surrounding the display region, wherein the non-display region is provided with a color film substrate cutting line, the color film substrate cutting line is a straight line that crosses an entirety of the non-display region and is parallel to and spaced apart from a side of the display region, an area of the non-display region corresponding to the color film substrate cutting line comprises a substrate, a first metal pattern disposed on a surface of the substrate, a buffer layer covering the first metal pattern and the substrate, a second metal pattern disposed on a surface of the buffer layer away from the substrate, a dielectric layer covering the second metal pattern and the buffer layer, a third metal pattern disposed on a surface of the dielectric layer away from the substrate, a planarization layer covering the third metal pattern and the dielectric layer, and an electrically conductive line disposed above a surface of the planarization layer away from the substrate, and at the color film substrate cutting line, projections of the first metal pattern, the second metal pattern, and the third metal pattern on the substrate completely overlap with a projection of the electrically conductive line on the substrate.

2. The array substrate of claim 1, wherein the area of the non-display region corresponding to the color film substrate cutting line further comprising:
    a first insulating layer disposed between the planarization layer and the electrically conductive line; and
    a second insulating layer covering the electrically conductive line and the first insulating layer.

3. The array substrate of claim 1, wherein the first metal pattern, the second metal pattern, and the third metal pattern are only disposed at the color film substrate cutting line in the non-display region.

4. The array substrate of claim 1, wherein the display region comprises a light shielding metal layer, a gate, and a source/drain, the first metal pattern and the light shielding metal layer are disposed on a same layer, the second metal pattern and the gate are disposed on a same layer, and the third metal pattern and the source/drain are disposed on a same layer.

5. The array substrate of claim 4, wherein the first metal pattern and the light shielding metal layer are formed using a first patterning process, the second metal pattern and the gate are formed using a second patterning process, and the third metal pattern and the source/drain are formed using a third patterning process.

6. A display panel, comprising an array substrate, wherein the array substrate comprises a display region and a non-display region surrounding the display region, the non-display region is provided with a color film substrate cutting line, the color film substrate cutting line is a straight line that crosses an entirety of the non-display region and is parallel to and spaced apart from a side of the display region, an area of the non-display region corresponding to the color film substrate cutting line comprises a substrate, a first metal pattern disposed on a surface of the substrate, a buffer layer covering the first metal pattern and the substrate, a second metal pattern disposed on a surface of the buffer layer away from the substrate, a dielectric layer covering the second metal pattern and the buffer layer, a third metal pattern disposed on a surface of the dielectric layer away from the substrate, a planarization layer covering the third metal pattern and the dielectric layer, and an electrically conductive line disposed above a surface of the planarization layer away from the substrate, and at the color film substrate cutting line, projections of the first metal pattern, the second metal pattern, and the third metal pattern on the substrate completely overlap with a projection of the electrically conductive line on the substrate.

7. The array substrate of claim 6, wherein the area of the non-display region corresponding to the color film substrate cutting line further comprises:
   a first insulating layer disposed between the planarization layer and the electrically conductive line; and
   a second insulating layer covering the electrically conductive line and the first insulating layer.

8. The array substrate of claim 6, wherein the display region comprises a light shielding metal layer, a gate, and a source/drain, the first metal pattern and the light shielding metal layer are disposed on a same layer, the second metal pattern and the gate are disposed on a same layer, and the third metal pattern and the source/drain are disposed on a same layer.

9. The array substrate of claim 6, wherein the first metal pattern, the second metal pattern, and the third metal pattern are only disposed at the color film substrate cutting line in the non-display region.

* * * * *